United States Patent
Lee et al.

(10) Patent No.: US 7,602,043 B2
(45) Date of Patent: Oct. 13, 2009

(54) COUPLING CAPACITOR AND SEMICONDUCTOR MEMORY DEVICE USING THE SAME

(75) Inventors: Eun-Cheol Lee, Gyeonggi-do (KR); Won-Suk Yang, Gyeonggi-do (KR); Jin-Woo Lee, Gyeonggi-do (KR); Tae-Young Chung, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 176 days.

(21) Appl. No.: 11/461,344

(22) Filed: Jul. 31, 2006

(65) Prior Publication Data

US 2007/0096191 A1    May 3, 2007

(30) Foreign Application Priority Data

Nov. 3, 2005   (KR) ...................... 10-2005-0105102

(51) Int. Cl.
  *H01L 27/06*  (2006.01)
  *H01L 27/08*  (2006.01)
(52) U.S. Cl. ............... 257/535; 257/532; 257/E27.016; 257/E27.048
(58) Field of Classification Search ................. 257/532, 257/535, E27.016, E27.048
See application file for complete search history.

(56) References Cited

U.S. PATENT DOCUMENTS

| | | | |
|---|---|---|---|
| 5,856,938 A | 1/1999 | Kasai et al. | |
| 6,448,852 B1 * | 9/2002 | Compton et al. | 330/251 |
| 6,720,598 B1 * | 4/2004 | Wohlfahrt | 257/295 |
| 6,826,072 B2 * | 11/2004 | Takashima | 365/145 |
| 2002/0071324 A1 | 6/2002 | Kitsukawa et al. | |
| 2002/0096771 A1 * | 7/2002 | Yamada et al. | 257/758 |
| 2004/0056286 A1 * | 3/2004 | Jacob et al. | 257/295 |
| 2004/0056287 A1 * | 3/2004 | Wohlfahrt | 257/295 |

FOREIGN PATENT DOCUMENTS

JP    11-330272    11/1999

(Continued)

OTHER PUBLICATIONS

English language abstract of Korean Publication No. 10-1997-0063724, Sep. 12, 1997.

(Continued)

*Primary Examiner*—Victor A Mandala
(74) *Attorney, Agent, or Firm*—Marger Johnson & McCollom, P.C.

(57) ABSTRACT

A coupling capacitor and a semiconductor memory device using the same are provided. In an embodiment, each memory cell of the semiconductor memory device includes a coupling capacitor so that a storage capacitor can store at least 2 bits of data. The coupling capacitor has a capacitance having a predetermined ratio with respect to the capacitance of the storage capacitor. For this, the coupling capacitor is formed by substantially the same fabrication process as the storage capacitor. The predetermined ratio is obtained by choosing an appropriate number of individual capacitors, each with the same capacitance of the storage capacitor, to comprise the coupling capacitor. Also, the coupling capacitor is disposed on an interlayer insulating layer that buries a bit line in a cell region and a sense amplifier in a sense amplifier region.

18 Claims, 11 Drawing Sheets

FOREIGN PATENT DOCUMENTS

| | | |
|---|---|---|
| KR | 10-1997-0063724 | 9/1997 |
| KR | 2001-0059663 | 7/2001 |
| KR | 2003-0001242 | 1/2003 |

OTHER PUBLICATIONS

English language abstract of Japanese Publication No. 11-330272, Nov. 30, 1999.

English language abstract of Korean Publication No. 2001-0059663, Jul. 6, 2001.

English language abstract of Korean Publication No. 2003-0001242, Jan. 6, 2003.

* cited by examiner

COUPLING CAPACITOR AND SEMICONDUCTOR MEMORY DEVICE USING THE SAME

CROSS-REFERENCE TO THE RELATED APPLICATION

This application claims the benefit of Korean Patent Application No. 2005-0105102, filed Nov. 3, 2005, the contents of which are hereby incorporated herein by reference in their entirety.

BACKGROUND

1. Field of the Invention

The present invention relates to a semiconductor memory device and, more particularly, to a semiconductor memory device that can store at least 2 bits of data in each memory cell.

2. Description of Related Art

A semiconductor memory device stores data at a designated address. A typical dynamic random access memory (DRAM) includes a plurality of memory cells, each of which stores 1 bit of data. Each of the memory cells includes a cell transistor and a storage capacitor to store the 1 bit of data or read the stored data. Also, each of the memory cells includes a sense amplifier to amplify data transferred through the cell transistor from the storage capacitor.

Meanwhile, the design rule of memory devices is being reduced to store more data in a given area. To accomplish such a reduction, the resolution of photolithography of a semiconductor fabrication process must first be improved. However, such an increase in the resolution of the photolithography process is reaching a technical limit. Specifically, to increase the resolution, a short-wavelength light source should be used when forming a photoresist pattern. Further, to use the short-wavelength light source, it is necessary to develop new photoresist that reacts desirably to the short-wavelength light source.

Recently, there's been a great deal of research into overcoming the foregoing problems and improving the memory size of a memory device without reducing the design rule.

A multi-level cell DRAM, under study lately, is a memory that can store at least 2 bits of data in each memory cell. That is, memory size can be at least doubled without decreasing a conventional design rule.

In the foregoing multi-level cell DRAM, each memory cell should include a coupling capacitor to store at least 2 bits of data.

Japanese Patent Laid-open Publication No. 11-330272 discloses structures of a multi-level cell DRAM and a coupling capacitor. In this disclosure, coupling capacitors are arranged in series, and adjacent coupling capacitors are connected using a contact plug and a bit line.

Also, Korean Registered Patent No. 231404 introduces structures of a multi-level cell DRAM and a coupling capacitor. In this disclosure, coupling capacitors are connected in series, and adjacent coupling capacitors are connected using a contact plug and a gate electrode.

However, the above disclosures fail to provide a method of controlling the capacitance of the coupling capacitor during a fabrication process. Specifically, the capacitance of the coupling capacitor should be, for example, about ⅕ or ⅓ the capacitance of a storage capacitor for storing data, depending on the type of a cell structure. However, the capacitance of the coupling capacitor, which is separately formed in an isolation region, cannot be maintained in appropriate proportion to the capacitance of the storage capacitor. That is, the capacitance of the coupling capacitor may vary with various variables during sequentially performed processes.

SUMMARY

An embodiment provides a coupling capacitor of a semiconductor memory device, which is fabricated under the same conditions as a storage capacitor of the semiconductor memory device.

Another embodiment provides a semiconductor memory device having the above-described coupling capacitor.

In one aspect, some embodiments are directed to a coupling capacitor of a semiconductor memory device, which is disposed on an interlayer insulating layer and includes a plurality of serially connected capacitors, each capacitor including a lower electrode, a dielectric layer, and an upper electrode. The coupling capacitor includes: a first capacitor formed on a first pad disposed on the interlayer insulating layer; a second capacitor formed on a second pad adjacent to the first pad, and electrically connected to the first capacitor through a common upper electrode; and a third capacitor formed on the second pad and electrically connected to the second capacitor through the second pad, wherein upper and lower electrodes of the coupling capacitor are the first pad and an upper electrode of the third capacitor.

In another aspect, some embodiments are directed to a coupling capacitor of a semiconductor memory device, which is disposed on an interlayer insulating layer and includes a plurality of serially connected capacitor groups. Each of the capacitor groups includes: a first capacitor unit formed on a first pad disposed on the interlayer insulating layer; and a second capacitor unit formed on a common pad adjacent to the first pad, and connected in series to the first capacitor unit through a common upper electrode, wherein adjacent capacitor units are electrically connected through the common pad, and capacitors of each of the first and second capacitor units are connected in parallel.

In still another aspect, some embodiments are directed to a semiconductor memory device including: a cell region in which a cell transistor and a storage capacitor are disposed; a sub-word driver region disposed in a first region adjacent to the cell region, the sub-word driver region having a sub-word driver for enabling a word line of the cell transistor; and a sense amplifier region disposed in a second region adjacent to the cell region, a sense amplifier and a coupling capacitor being disposed in the sense amplifier region; wherein the coupling capacitor is disposed on an interlayer insulating layer that buries a bit line in the cell region and the sense amplifier in the sense amplifier region.

BRIEF DESCRIPTION OF THE DRAWINGS

The foregoing and other objects, features and advantages of the invention will be apparent from the more particular description of exemplary embodiments of the invention, as illustrated in the accompanying drawings. The drawings are not necessarily to scale, emphasis instead being placed upon illustrating the principles of the invention.

DETAILED DESCRIPTION

The present invention will now be described more fully hereinafter with reference to the accompanying drawings, in which exemplary embodiments are shown.

Figure 1:
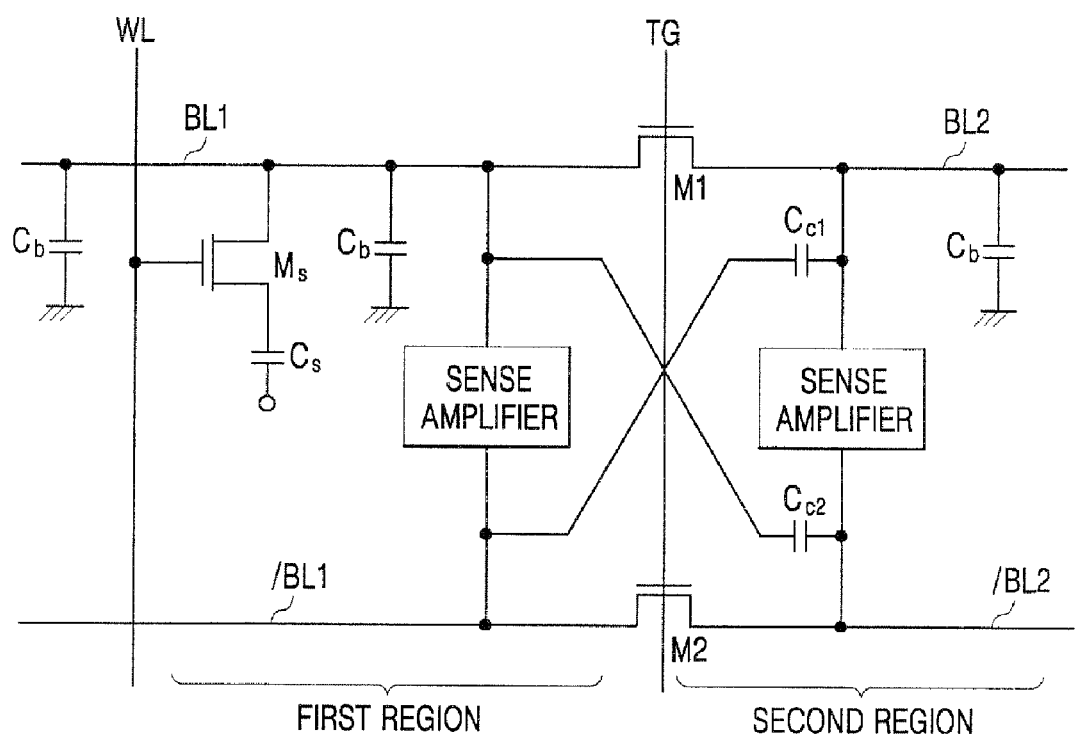
FIG. 1 is a circuit diagram of a memory cell according to an exemplary embodiment.

FIG. 1 is a circuit diagram of a memory cell according to an exemplary embodiment.

Referring to FIG. 1, it can be seen that the memory cell is a cell of a multi-level cell DRAM.

The memory cell includes first and second bit lines BL1 and BL2 and inverted first and second bit lines (hereinafter referred to as "/first and second bit lines") /BL1 and /BL2, a word line WL, a cell transistor Ms, a storage capacitor Cs connected to the cell transistor Ms, two sense amplifiers, two coupling capacitors Cc1 and Cc2, and transfer transistors M1 and M2 that electrically divide the bit lines.

The storage capacitor Cs is maintained at one of four levels, i.e., a Vcc level corresponding to a binary number "11," a ⅔ Vcc level corresponding to a binary number "10," a ⅓ Vcc level corresponding to a binary number "01," and a ground level corresponding to a binary number "00."

First, the first and second bit lines BL1 and BL2 and the /first and second bit lines /BL1 and /BL2 are precharged to ½ Vcc. In this case, the transfer transistors M1 and M2 are turned on, so that the first and second bit lines BL1 and BL2 on both sides of the transfer transistors M1 and M2 remain at the same level.

When the word line WL is enabled, the cell transistor Ms is turned on and charges accumulated in the storage capacitor Cs are transferred to the first bit line BL1, and the transfer transistor M1 is turned off in response to a control signal TG. Accordingly, the first and second bit lines BL1 and BL2 remain in an electrically open state.

Thereafter, the sense amplifier in a first region is enabled, and a signal transferred to the first bit line BL1 is amplified to a Vcc level and a ground level. In FIG. 1, data amplified by the sense amplifier in the first region becomes the most significant bit (MSB) data. The data amplified by the sense amplifier in the first region is transferred to the second bit line BL2 and the /second bit line /BL2 in a second region by the capacitance-coupled coupling capacitors Cc1 and Cc2. Due to the coupling of the coupling capacitors Cc1 and Cc2, the data of the second bit line BL2 and the /second bit line /BL2 in the second region changes in a direction opposite to data of the first bit line BL1 and the /first bit line /BL1 in the first region.

Subsequently, when the sense amplifier in the second region is enabled, the data of the second bit line BL2 and the /second bit line /BL2 in the second region is amplified. The data amplified by the sense amplifier in the second region becomes the least significant bit (LSB) data.

When 2 bits of data are stored in the storage capacitor Cs, the weight of the MSB data becomes twice the weight of the LSB data. Accordingly, a capacitance 2Cb of the first bit line BL1 that outputs the MSB data should be twice a capacitance Cb of the second bit line BL2 that outputs the LSB data.

FIGS. 2A through 2D are timing diagrams illustrating the operation of the memory cell shown in FIG. 1.

Figure 2A:
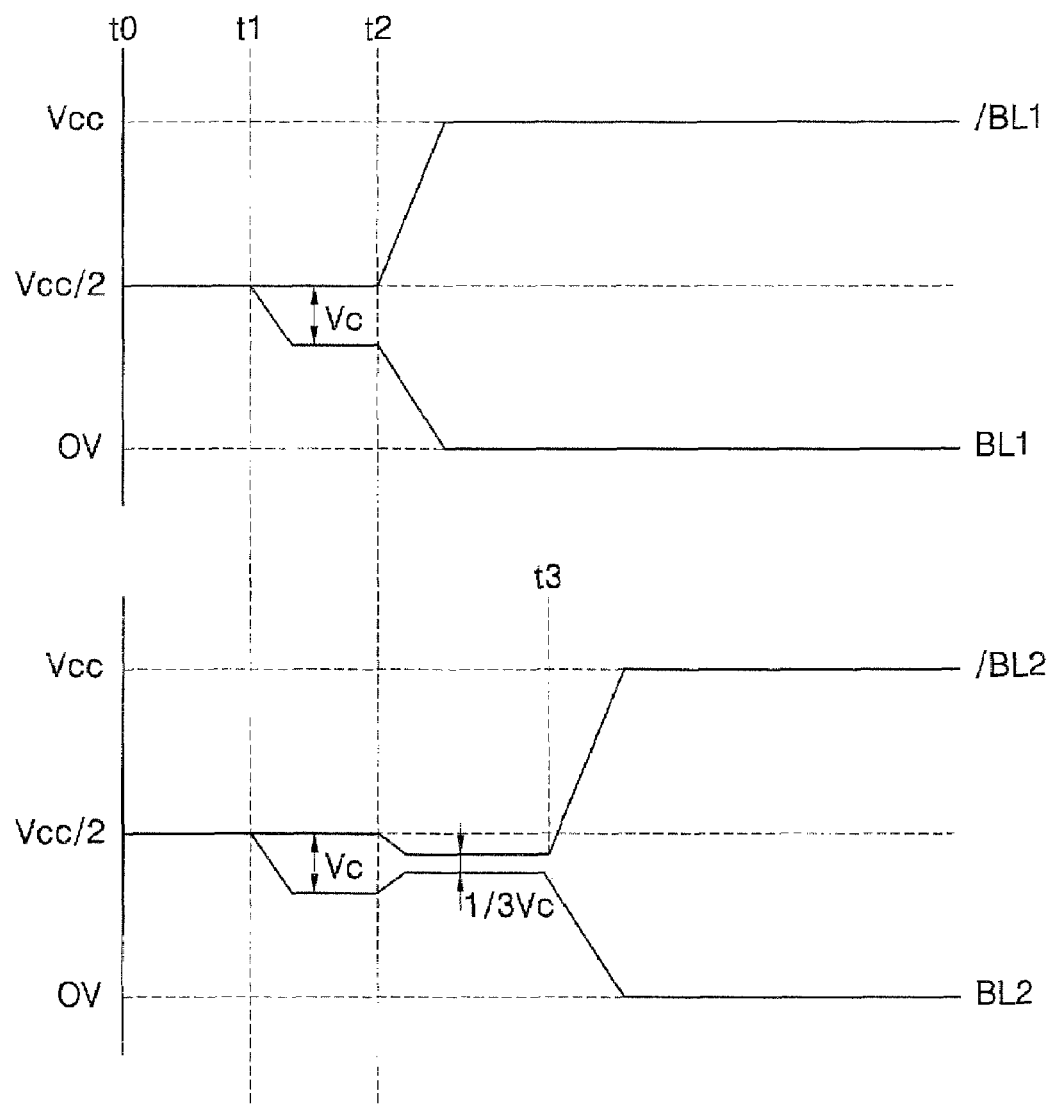
FIGS. 2A through 2D are timing diagrams illustrating the operation of the memory cell shown in FIG. 1.

FIG. 2A is a timing diagram illustrating a read operation of the memory cell when a binary bit "00" is stored in the storage capacitor Cs.

Referring to FIG. 2A, the first bit line BL1 and the /first bit line /BL1 are precharged to ½ Vcc at a time t0. Also, since the transfer transistors M1 and M2 remain turned on, the second bit line BL2 and the /second bit line /BL2 also are precharged to ½ Vcc. Further, the storage capacitor Cs is maintained at a voltage of 0 V.

When the word line Wt, is enabled at a time t1, the voltage of the first bit line BL1 drops due to the voltage of the storage capacitor Cs. Also, because the sense amplifier in the first region is not enabled, the /first bit line /BL1 is maintained at ½ Vcc. Thus, there remains a voltage difference of Vc between the /first bit line /BL1 and the first bit line BL1.

Also, since the transfer transistors M1 and M2 remain turned on, the /second bit line /BL2 is maintained at a higher level than the second bit line BL2, and there remains a voltage difference of Vc between the /second bit line /BL2 and the second bit line BL2.

Subsequently, when the sense amplifier in the first region is enabled at a time t2, the sense amplifier in the first region amplifies the voltage difference between the /first bit line /BL1 and the first bit line BL1. Thus, a data signal having a Vcc level is output to the /first bit line /BL1, and a data signal having 0 V is output to the first bit line BL1. Accordingly, MSB output through the first bit line BL1 becomes a binary number "0."

Also, before or when the sense amplifier in the first region is enabled at the time t2, the transfer transistors M1 and M2 are turned off. Thus, the first bit line BL1 and the second bit line BL2 are electrically opened, and the /first bit line /BL1 and the /second bit line /BL2 also are electrically opened. When the sense amplifier in the first region is enabled at the time t2 and data of the /first bit line /BL1 rises to Vcc, data of the second bit line BL2 also rises due to the coupling capacitor Cc1. Also, when data of the first bit line BL1 drops to 0 V, the /second bit line /BL2 also drops due to the coupling capacitor Cc2. The range of a rise in the voltage level of the data of the second bit line BL2 and the range of a fall in the voltage level of the data of the /second bit line /BL2 are Vc/3. Accordingly, the data of the /second bit line /BL2 remains at a higher level than the data of the second bit line BL2.

When the sense amplifier in the second region is enabled at a time t3, data of the /second bit line /BL2 rises to Vcc, and data of the second bit line BL2 drops to 0 V. That is, LSB data output through the second bit line BL2 becomes a binary number "0."

Although not shown in FIG. 2A, the read operation is followed by an operation of restoring data stored in the storage capacitor Cs, which is performed by turning on the transfer transistors M1 and M2.

Figure 2B:
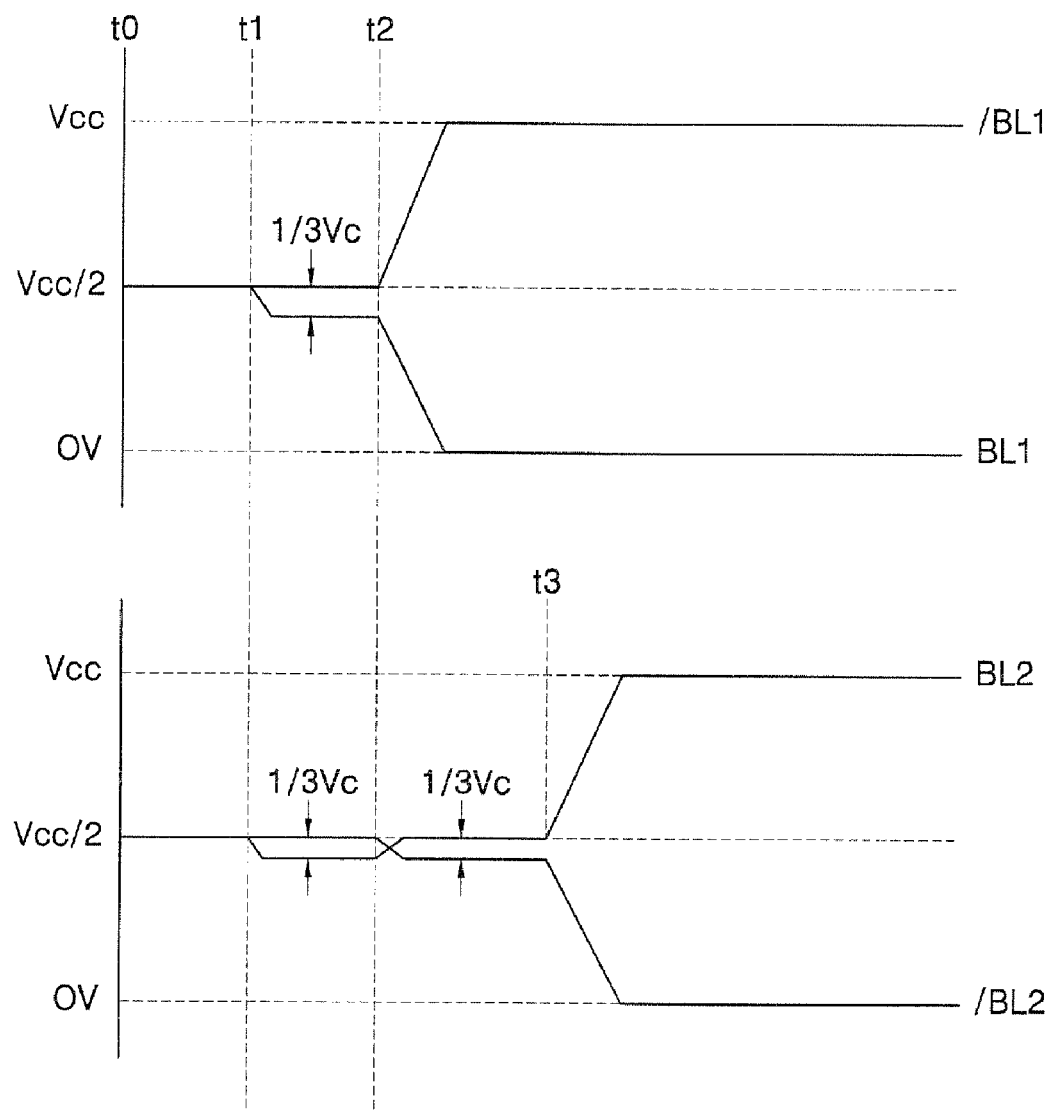

FIG. 2B is a timing diagram illustrating a read operation of the memory cell when a binary bit "01" is stored in the storage capacitor Cs.

Referring to FIG. 2B, at a time t0, the transfer transistors M1 and M2 remain turned on between the first and second bit lines BL1 and BL2 precharged to ½ Vcc. Also, the storage capacitor Cs is maintained at ⅓ Vcc.

When the word line WL is enabled at a time t1, the cell transistor Ms is turned on, the voltage of the first bit line BL1 drops from ½ Vcc due to the data stored in the storage capacitor Cs. The range of a fall in the voltage of the first bit line BL1 becomes ⅓ Vc. Also, at the time t1, the voltage of the second bit line BL2 also falls due to the turned-on transfer transistor M1, and the range of a fall in the voltage of the second bit line BL2 also becomes ⅓ Vc. Even if the voltages on the first and second bit lines BL1 and BL2 drop, since the sense amplifiers are not enabled, the /first bit line /BL1 and the /second bit line /BL2 are maintained at a precharge voltage of ½ Vcc. Thus, there is a voltage difference of ⅓ Vc between the /first bit line /BL1 and the first bit line BL1, and there is a voltage difference of ⅓ Vc between the /second bit line /BL2 and the second bit line BL2.

Thereafter, the transfer transistors M1 and M2 are turned off, and the sense amplifier in the first region is enabled. The enabled sense amplifier in the first region causes the /first bit line /BL1 having a higher data voltage than the first bit line BL1 to rise to Vcc, and the data voltage of the bit line BL1 drops to 0 V. Thus, MSB output through the first bit line BL1 becomes a binary number "0."

A voltage of the second bit line BL2 changes with a fall in the voltage of the first bit line BL1, and the voltage of the /second bit line /BL2 changes with a rise in the voltage of the /first bit line /BL1. That is, while the voltage of the /first bit line /BL1 rises to Vcc, the voltage of the second bit line BL2 that is electrically coupled to the /first bit line /BL1 by the coupling capacitor Cc1 rises. The range of a rise in the voltage of the second bit line BL2 becomes ⅓ Vc. Also, while the voltage of the first bit line BL1 drops to 0 V, the voltage of the /second bit line /BL2 that is electrically coupled to the first bit line BL1 by the coupling capacitor Cc2 drops. The range of a fall in the voltage of the /second bit line /BL2 becomes ⅓ Vc.

Accordingly, when the sense amplifier in the first region is enabled and the voltage of the first bit line BL1 drops to 0 V, the voltage of the second bit line BL2 becomes higher than the voltage of the /second bit line /BL2.

When the sense amplifier in the second region is enabled at a time t3, the enabled sense amplifier in the second region causes the second bit line BL2 having a higher data voltage than the /second bit line /BL2 to rise to Vcc. Also, the enabled sense amplifier in the second region causes a data voltage of the /second bit line /BL2 to drop to 0 V. Accordingly, LSB output through the second bit line BL2 becomes a binary number "11."

Although not shown in FIG. 2B, the read operation is followed by an operation of restoring data in the storage capacitor Cs, which is performed by turning on the transfer transistors M1 and M2. That is, since the capacitance 2Cb of the first bit line BL1 is twice the capacitance Cb of the second bit line BL2, a voltage of ⅓ Vcc is stored in the storage capacitor Cs.

Figure 2C:
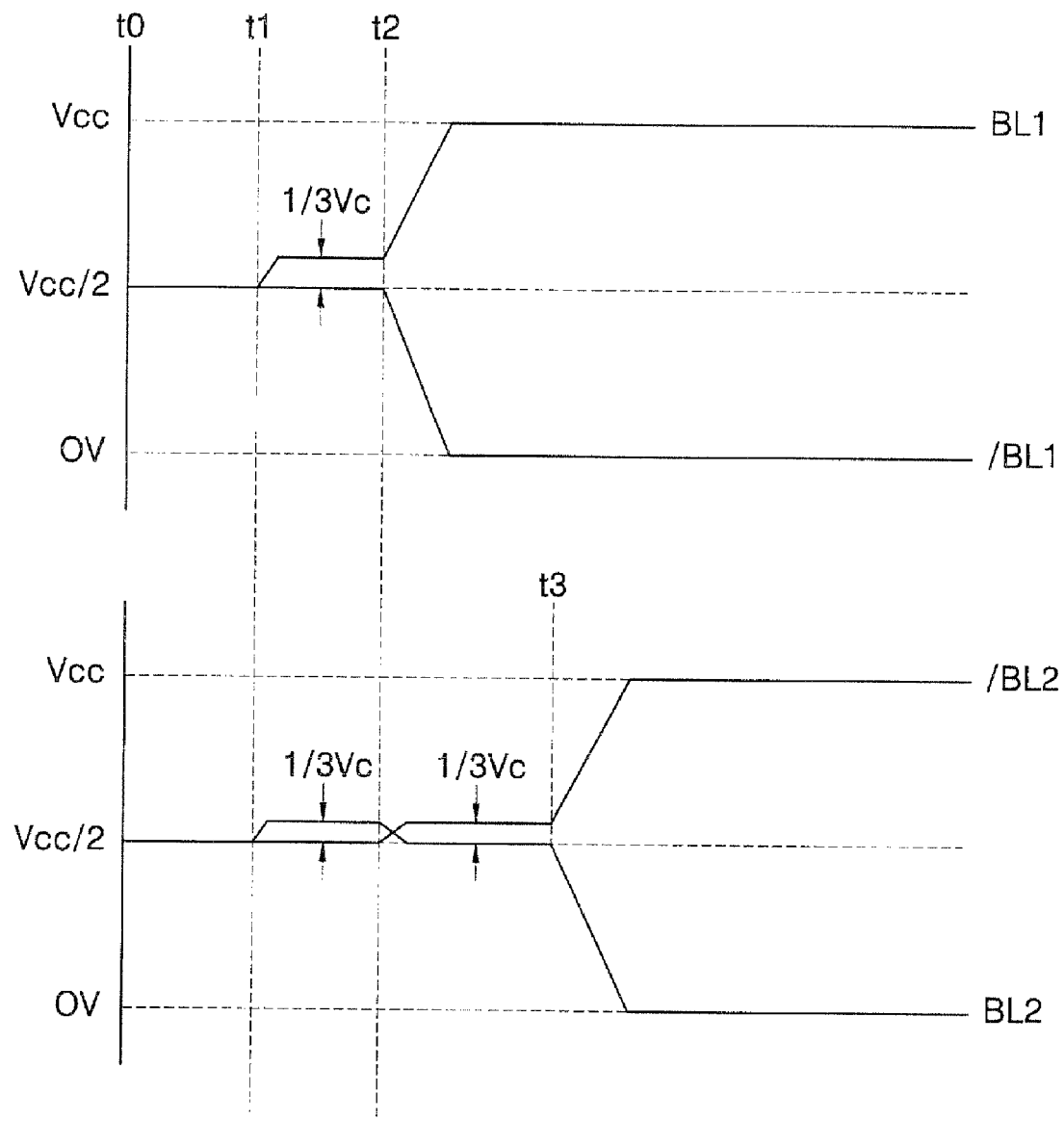

FIG. 2C is a timing diagram illustrating a read operation of the memory cell when a binary bit "10" is stored in the storage capacitor Cs.

Referring to FIG. 2C, at a time t0, the transfer transistors M1 and M2 remain turned on between the bit lines that are precharged to ½ Vcc. Also, the storage capacitor Cs is maintained at ⅔ Vcc.

When the word line WL is enabled at a time t1, the cell transistor Ms is turned on, and data stored in the storage capacitor Cs causes the voltage of the first bit line BL1 to rise from ½ Vcc. The range of a rise in the voltage of the first bit line BL1 becomes ⅓ Vc. Also, at the time t1, the turned-on transfer transistor M1 causes the voltage of the second bit line BL2 to rise, and the range of a rise in the voltage of the second bit line BL2 becomes ⅓ Vc. Even if the voltages at the first and second bit lines BL1 and BL2 rise, since the sense amplifiers are not enabled, the /first bit line /BL1 and the /second bit line /BL2 are maintained at a precharge voltage of ½ Vcc. Thus, there is a voltage difference of ⅓ Vc between the /first bit line /BL1 and the first bit line BL1, and there is a voltage difference of ⅓ Vc between the /second bit line /BL2 and the second bit line BL2.

Thereafter, the transfer transistors M1 and M2 are turned off, and the sense amplifier in the first region is enabled. The enabled sense amplifier in the first region causes the first bit line BL1 having a higher data voltage than the /first bit line /BL1 to rise to Vcc, and the /first bit line /BL1 drops to 0 V. Thus, MSB output through the first bit line BL1 becomes a binary number "1."

A voltage of the second bit line BL2 changes with a rise in the voltage of the first bit line BL1, and the voltage of the /second bit line /BL2 changes with a fall in the voltage of the /first bit line /BL1. That is, while the voltage of the first bit line BL1 rises to Vcc, the voltage of the /second bit line /BL2 that is electrically coupled to the first bit line BL1 by the coupling capacitor Cc2 rises. The range of a rise in the voltage of the /second bit line /BL2 becomes ⅓ Vc. Also, while the voltage of the /first bit line /BL1 drops to 0 V, the voltage of the second bit line BL2 that is electrically coupled to the /first bit line /BL1 by the coupling capacitor Cc1 drops. The range of a fall in the voltage of the second bit line BL2 becomes ⅓ Vc.

Accordingly, when the sense amplifier in the first region is enabled and the voltage of the first bit line BL1 rises to Vcc, the voltage of the /second bit line /BL2 becomes higher than the voltage of the second bit line BL2.

When the sense amplifier in the second region is enabled at a time t3, the enabled sense amplifier in the second region causes the /second bit line /BL2 having a higher data voltage than the second bit line BL2 to rise to Vcc. Also, the enabled sense amplifier in the second region causes a data voltage of the second bit line BL2 to drop to 0 V. Accordingly, LSB output through the second bit line BL2 becomes a binary number "0."

Although not shown in FIG. 2C, the read operation is followed by an operation of restoring data in the storage capacitor Cs, which is performed by turning on the transfer transistors M1 and M2. That is, since the capacitance 2Cb of the first bit line BL1 is twice the capacitance Cb of the second bit line BL2, a voltage of ⅔ Vcc is stored in the storage capacitor Cs.

Figure 2D:
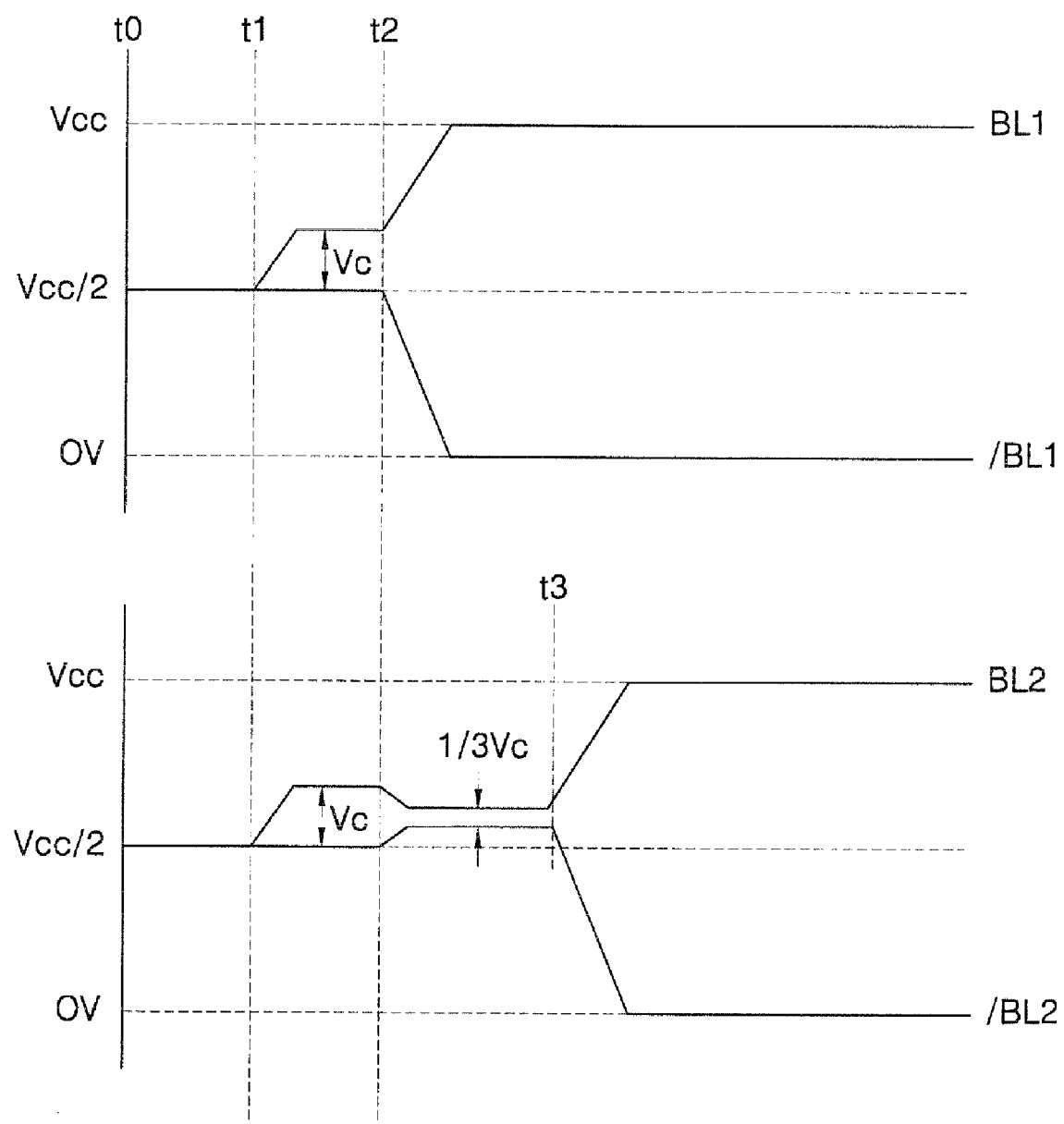

FIG. 2D is a timing diagram illustrating a read operation of the memory cell when a binary bit "11" is stored in the storage capacitor Cs.

Referring to FIG. 2D, at a time t0, the transfer transistors M1 and M2 remain turned on between the first and second bit lines BL1 and BL2 that are precharged to ½ Vcc. Also, the storage capacitor Cs is maintained at Vcc.

When the word line WL is enabled at a time t1, the cell transistor Ms is turned on, the voltage of the first bit line BL1 rises from ½ Vcc due to data stored in the storage capacitor Cs. The range of a rise in the voltage of the first bit line BL1 becomes Vc. Also, at the time t1, the voltage of the second bit line BL2 also rises due to the turned-on transfer transistor M1, and the range of a rise in the voltage of the second bit line BL2 also becomes Vc. Even if the voltages at the first and second bit lines BL1 and BL2 rise, since the sense amplifiers are not enabled, the /first bit line /BL1 and the /second bit line /BL2 are maintained at a precharge voltage of ½ Vcc. Thus, there is a voltage difference of Vc between the /first bit line /BL1 and the first bit line BL1, and there is a voltage difference of Vc between the /second bit line /BL2 and the second bit line BL2.

Thereafter, the transfer transistors M1 and M2 are turned off, and the sense amplifier in the first region is enabled. The enabled sense amplifier in the first region causes the first bit line BL1 having a higher data voltage than the /first bit line /BL1 to rise to Vcc, and the data voltage of the /bit line /BL1 drops to 0 V. Thus, MSB output through the first bit line BL1 becomes a binary number "1."

A voltage of the second bit line BL2 changes with a rise in the voltage of the first bit line BL1, and the voltage of the /second bit line /BL2 changes with a fall in the voltage of the /first bit line /BL1. That is, while the voltage of the first bit line BL1 rises to Vcc, the voltage of the /second bit line /BL2 that is electrically coupled to the first bit line BL1 by the coupling capacitor Cc1 rises. The range of a rise in the voltage of the /second bit line /BL2 becomes ⅓ Vc. Also, while the voltage of the /first bit line /BL1 drops to 0 V, the voltage of the second bit line BL2 that is electrically coupled to the /first bit line /BL1 by the coupling capacitor Cc1 drops. The range of a fall in the voltage of the second bit line BL2 becomes ⅓ Vc.

Even though the voltage of the /second bit line /BL2 rises and the voltage of the second bit line BL2 drops, the second bit line BL2 can be maintained at a voltage level that is higher than the /second bit line /BL2 by ⅓ Vc.

When the sense amplifier in the second region is enabled at a time t3, the enabled sense amplifier in the second region causes a data voltage of the second bit line BL2 to rise to Vcc. Also, the enabled sense amplifier in the second region causes a data voltage of the /second bit line /BL2 to drop to 0 V. Accordingly, LSB output through the second bit line BL2 becomes a binary number "1."

Although not shown in FIG. 2D, the read operation is followed by an operation of restoring data in the storage capacitor Cs, which is performed by turning on the transfer transistors M1 and M2.

To perform the operations described with reference to FIGS. 2A through 2D, each of the coupling capacitors Cc1 and Cc2 should have a capacitance that is ⅓ that of the storage capacitor Cs.

Figure 3:
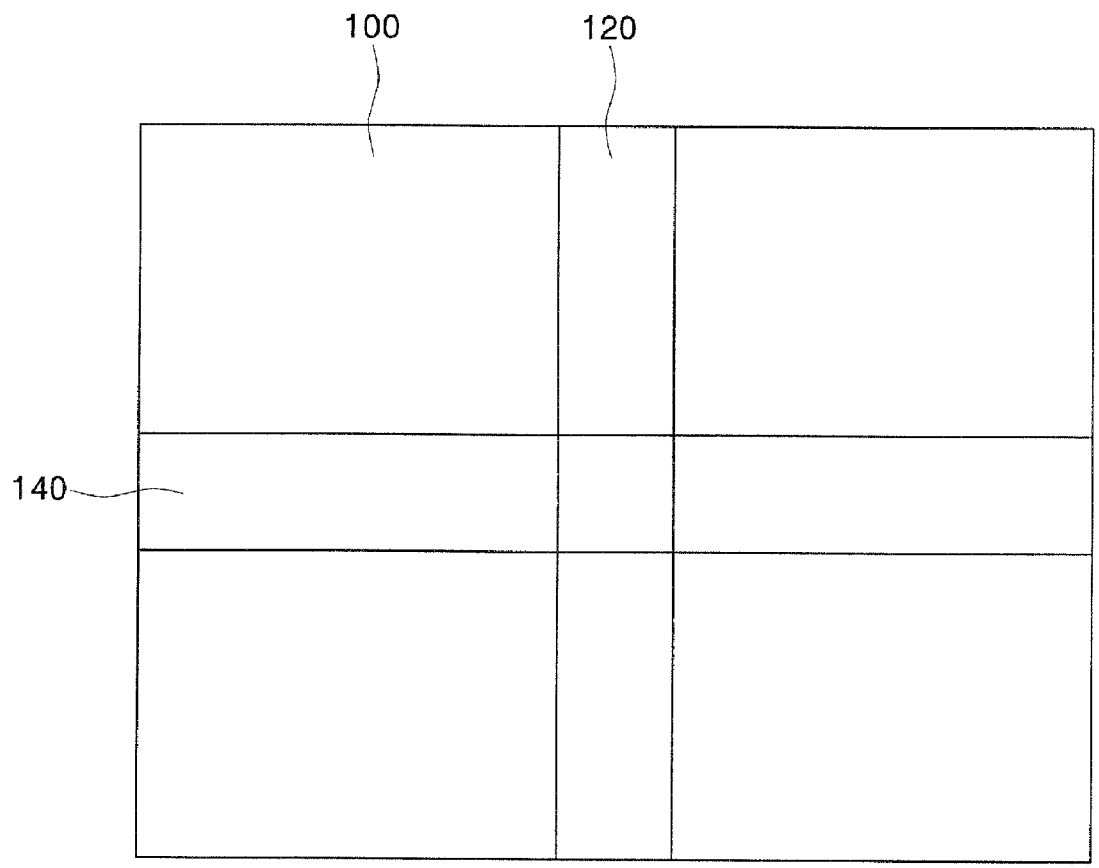
FIG. 3 is a plan view showing a region where coupling capacitors are formed according to an exemplary embodiment.

FIG. 3 is a plan view showing a region where coupling capacitors are formed according to an exemplary embodiment.

Referring to FIG. 3, a memory device is divided into a cell region 100, a sub-word driver region 120, and a sense amplifier region 140. FIG. 3 shows a portion of a core region in which patterns are arranged according to the design rules.

The cell transistor Ms and the storage capacitor Cs shown in FIG. 1 are repeatedly arranged in the cell region 100. The cell transistor and the storage capacitor are formed through a typical DRAM manufacturing process.

Also, a sub-word driver is disposed in the sub-word driver region 120. A word line used to control the on/off operation of the cell transistor is enabled or disabled by the sub-word driver. Thus, the word line used to drive the cell transistor is disposed across the cell region 100 from the sub-word driver region 120.

The sense amplifiers and the coupling capacitors shown in FIG. 1 are disposed in the sense amplifier region 140. The sense amplifiers and the coupling capacitors may be formed in different layers. Specifically, the sense amplifiers may be formed in a lower layer, the coupling capacitors may be formed in an upper layer, and an interlayer insulating layer may be disposed between the sense amplifiers and the coupling capacitors so that the sense amplifiers are physically isolated from the coupling capacitor. Also, the sense amplifiers and the coupling capacitors, which are formed in different layers, are electrically connected to each other by a contact plug disposed through the interlayer insulating layer.

The coupling capacitors disposed in the sense amplifier region 140 may be formed by the same process as the storage capacitor disposed in the cell region 100. That is, the coupling capacitors may be formed on the same interlayer insulating layer as the storage capacitor disposed in the cell region 100. Also, the interlayer insulating layer having the coupling capacitors is formed across the cell region 100 and the sense amplifier region 140. Thus, the interlayer insulating layer buries the bit lines in the cell region 100 and buries the sense amplifiers in the sense amplifier region 140.

Accordingly, the storage capacitor is formed on the interlayer insulating layer disposed in the cell region 100, and the coupling capacitors are formed on the interlayer insulating layer disposed in the sense amplifier region 140. The coupling capacitors are formed by the same process as the storage capacitor. In other words, the coupling capacitors are formed during the formation of the storage capacitor, and each of several capacitors comprising the coupling capacitors has the same structure as the storage capacitor and is formed on the same interlayer insulating layer as the storage capacitor. Thus, each of the capacitors comprising the coupling capacitor has a capacitance that is substantially equal to the capacitance Cs of the storage capacitor.

Even if the capacitance Cs of the storage capacitor is changed by a predetermined factor during a semiconductor fabrication process, the capacitance of each of the capacitors of the coupling capacitors is changed likewise, so that the characteristics of the coupling capacitors are constant, irrespective of changes in process. Thus, for example, if the desired capacitance of the coupling capacitor is one-third that of the storage capacitor, then the coupling capacitor can comprise three individual capacitors, each guaranteed to have a capacitance equal to that of the storage capacitor, in series. Capacitors in series are explained in detail below.

Figure 4A:
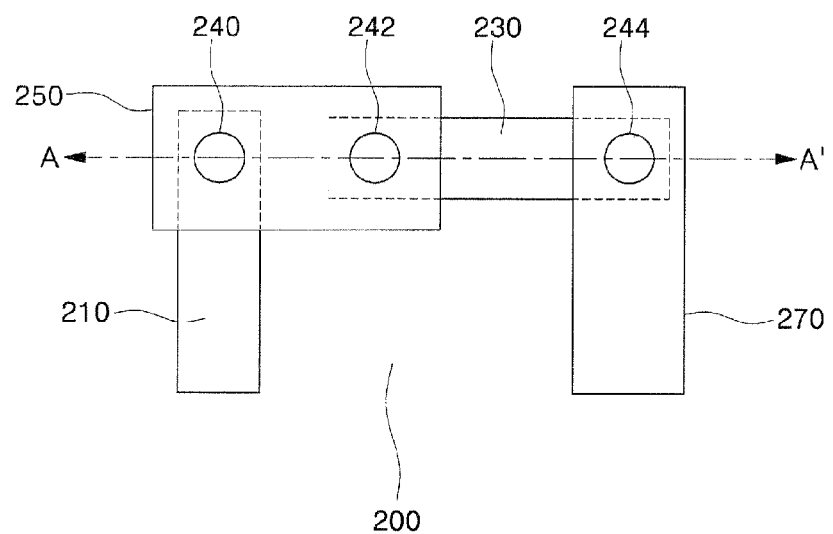
FIGS. 4A and 4B are plan and cross-sectional views of a coupling capacitor formed in a sense amplifier region shown in FIG. 3, respectively.
Figure 4B:
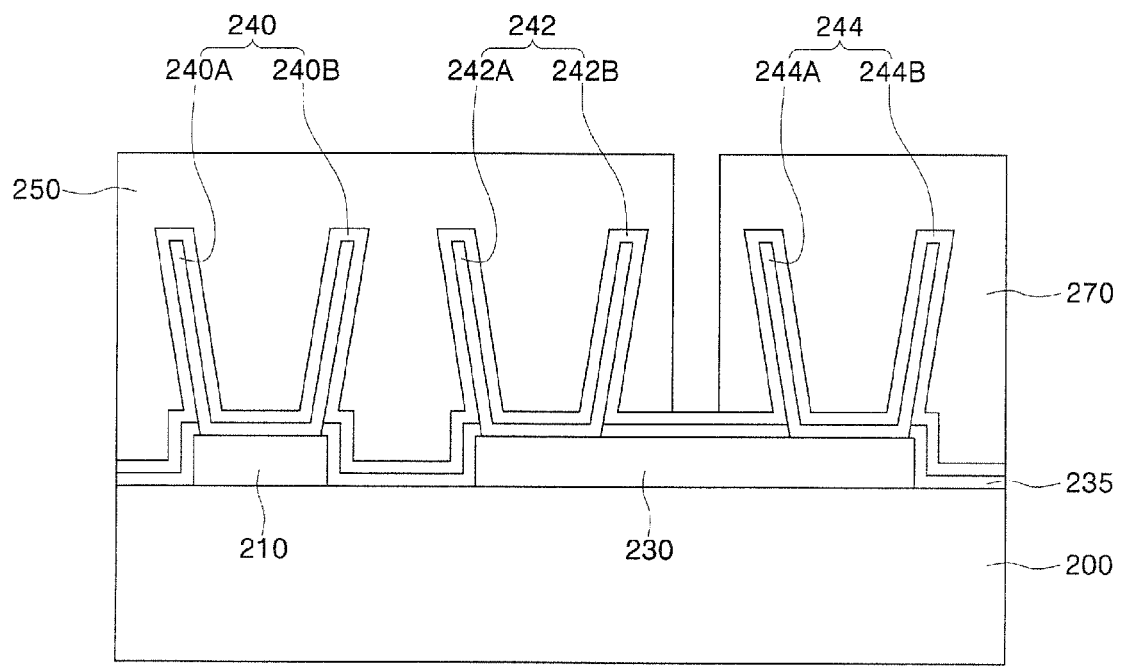

FIGS. 4A and 4B are plan and cross-sectional views of a coupling capacitor formed in the sense amplifier region 140 shown in FIG. 3.

FIG. 4A is a plan view of a coupling capacitor according to an exemplary.

Referring to FIG. 4A, the coupling capacitor includes three capacitors.

A first pad 210 and a second pad 230 are disposed on an interlayer insulating layer 200. The first and second pads 210 and 230 may be formed of polycrystalline silicon. Also, the interlayer insulating layer 200 having the first and second pads 210 and 230 may bury the bit line and the sense amplifier of the memory device shown in FIG. 3.

A first capacitor 240 is disposed on the first pad 210, and a second capacitor 242 and a third capacitor 244 are disposed on the second pad 230. Thus, the second capacitor 242 and the third capacitor 244 are electrically connected to each other by the second pad 230. Also, the first capacitor 240 and the second capacitor 242 are electrically connected to each other by a common upper electrode 250.

The first capacitor 240, the second capacitor 242, and the third capacitor 244 may be arranged in a line. Also, the first pad 210 extends in a direction orthogonal to the line in which the first, second, and third capacitors 240, 242, and 244 are arranged, so that the first pad 210 is electrically connected to a conductive line (not shown) by a contact plug (not shown). The conductive line electrically connected to the first pad 210 is connected to any one of the four bit lines shown in FIG. 1, as well as the sense amplifier corresponding to the same region as the connected bit line.

Accordingly, the first and second capacitors 240 and 242 have the upper electrode 250 in common, and the second and third capacitors 242 and 244 have a conductive pad in common. Also, an upper electrode 270 of the third capacitor 244 extends in a direction orthogonal to the line in which the first, second, and third capacitors 240, 242, and 244 are arranged. Also, the upper electrode 270 of the third capacitor 244 is electrically connected to a conductive line (not shown) by a contact plug (not shown). The conductive line electrically connected to the upper electrode 270 of the third capacitor 244 is one of the bit lines or the sense amplifiers shown in FIG. 1.

In this case, if the conductive line connected to the first pad 210 is connected to the first bit line BL1 shown in FIG. 1, the conductive line connected to the upper electrode 270 of the third capacitor 244 may be the /second bit line /BL2 and a second sense amplifier.

In FIG. 4A, the three capacitors 240, 242, and 244 are connected in series. That is, a lower electrode (not shown) of the first capacitor 240 is connected to the first pad 210, the upper electrode of the first capacitor 240 is the common upper electrode 250, and the common upper electrode 250 is also the upper electrode of the second capacitor 242. Thus, the first and second capacitors 240 and 242 have the upper electrode 250 in common.

Also, a lower electrode (not shown) of the second capacitor 242 is connected to the second pad 230, and the second pad 230 is connected to a lower electrode (not shown) of the third capacitor 244. The third capacitor 244 is connected to the conductive line by the upper electrode 270.

Further, each of the first, second, and third capacitors 240, 242, and 244 is formed by the same fabrication process as the storage capacitor formed in the cell region (100 of FIG. 3). In other words, while the capacitors 240, 242, and 244 shown in FIG. 4A are formed, the storage capacitors disposed in the cell region 100 are formed substantially at the same time. Accordingly, each of the capacitors 240, 242, and 244 has substantially the same capacitance as the storage capacitor.

For example, assuming that the capacitance of each of the capacitors 240, 242, and 244 is Cs and the capacitance of the storage capacitor is also Cs, a capacitance Cc of the coupling capacitor including the serially connected capacitors 240, 242, and 244 can be expressed by Equation 1:

$$\frac{1}{Cc} = \frac{1}{Cs} + \frac{1}{Cs} + \frac{1}{Cs} = \frac{3}{Cs} \quad (1)$$

Thus, the capacitance Cc of the coupling capacitor becomes Cs/3.

FIG. 4B is a cross-sectional view taken along line A-A' of FIG. 4A.

Referring to FIG. 4B, conductive pads (i.e., the first pad 210 and the second pad 230) are disposed on the interlayer insulating layer 200 formed on a substrate (not shown). The second pad 230 is formed a predetermined distance apart from the first pad 210.

The first capacitor 240 is formed on the first pad 210, and the second and third capacitors 242 and 244 are formed on the second pad 230. Also, an etch stop layer 235 is formed on the interlayer insulating layer 200 and lateral surfaces of the first and second pads 210 and 230. The etch stop layer 235 may be formed of silicon nitride.

The first capacitor 240 includes a lower electrode 240A and a dielectric layer 240B that are formed on the first pad 210, and the second capacitor 242 includes a lower electrode 242A and a dielectric layer 242B that are formed on the second pad 230. Also, the first and second capacitors 240 and 242 have an upper electrode 250 in common and are connected to each other through the common upper electrode 250.

Also, the second and third capacitors 242 and 244 are formed on the second pad 230. Thus, the lower electrode 242A of the second capacitor 240 is electrically connected to a lower electrode 244A of the third capacitor 244. However, the lower electrode 244A of the third capacitor 244 and the upper electrode 270 formed on a dielectric layer 244B of the third capacitor 244 are not directly connected to the common upper electrode 250.

Although not shown in FIGS. 4A and 4B, the storage capacitor is formed in the cell region 100 of FIG. 3 so that the storage capacitor has substantially the same structure as each of the first, second, and third capacitors 240, 242, and 244 shown in FIGS. 4A and 4B.

FIGS. 5A through 5E are cross-sectional views showing a method of fabricating the coupling capacitor shown in FIGS. 4A and 4B.

Figure 5A:
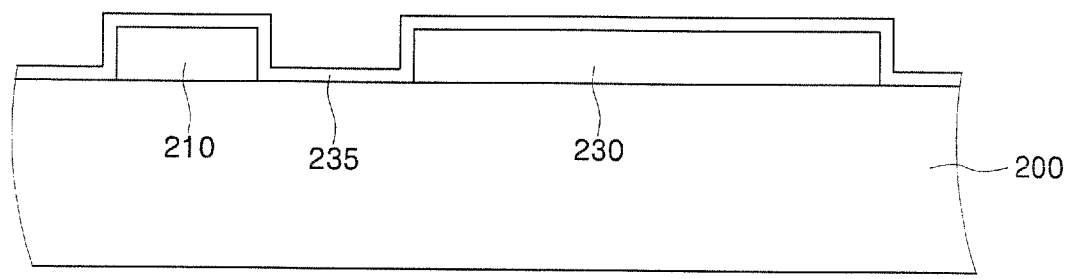
FIGS. 5A through 5E are cross-sectional views showing a method of fabricating the coupling capacitor shown in FIGS. 4A and 4B.

Referring to FIG. 5A, an interlayer insulating layer 200 is coated on a substrate having a sense amplifier, and a pad layer is formed on the interlayer insulating layer 200. The pad layer may be formed of polycrystalline silicon. Thereafter, a photoresist is formed on the pad layer to form a first pad 210 and a second pad 230 using a typical photolithography process.

Also, an etch stop layer 235 is coated on the first pad 210, the second pad 230, and the interlayer insulating layer 200. The etch stop layer 235 may be a silicon nitride layer.

The interlayer insulating layer 200 on which the first and second pads 210 and 230 are formed is formed across the cell region in which the cell transistor and the storage capacitor shown in FIG. 1 are formed. While the first and second pads 210 and 230 are formed, a pad for forming a storage capacitor may be formed in the cell region at the same time.

Figure 5B:
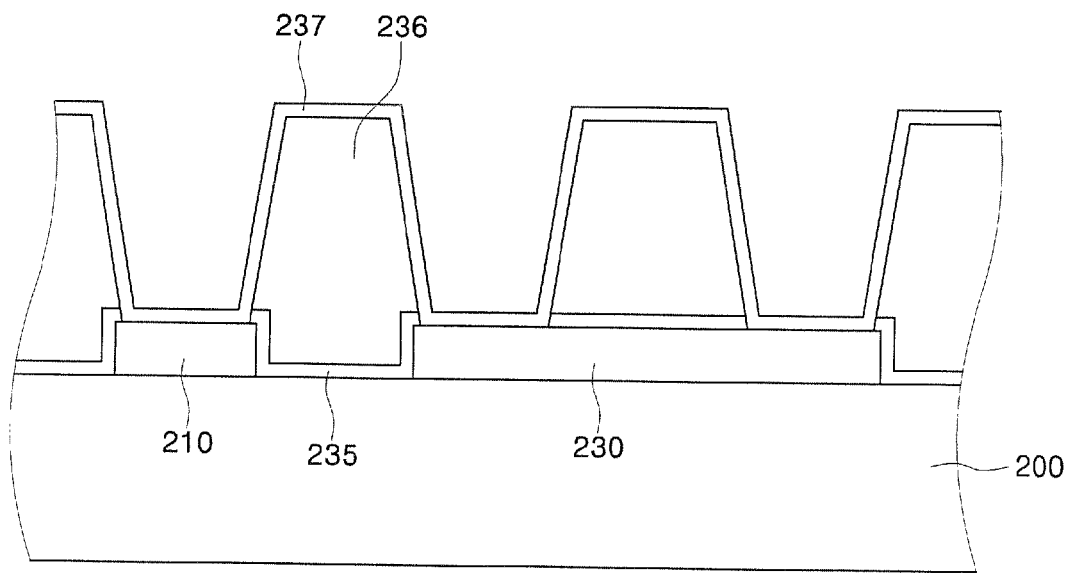

Referring to FIG. 5B, an oxide layer is coated on the substrate having the etch stop layer 235 and then patterned, thereby forming an oxide layer pattern 236. The formation of the oxide layer pattern 236 includes coating the oxide layer with a photoresist, patterning the photoresist, and performing an isotropic etching process. When the oxide layer pattern 236 is formed, the isotropic etching process may be performed until top surfaces of the first and second pads 210 and 230 are exposed.

Thereafter, a lower conductive layer 237 is formed on the oxide layer pattern 236 and the first and second pads 210 and 230. The lower conductive layer 237 may be formed of a conductive material, such as polycrystalline silicon.

Figure 5C:
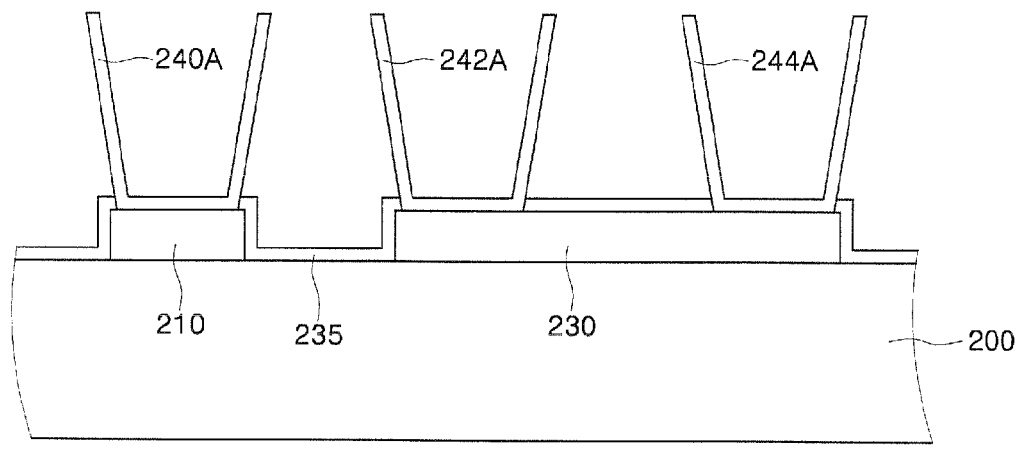

Referring to FIG. 5C, a portion of the lower conductive layer 237 is removed from the oxide layer pattern 236, thereby forming lower electrodes 240A, 242A, and 244A. The oxide layer pattern 236 is completely removed to expose the lower electrodes 240A, 242A, and 244A. The removal of the portion of the lower conductive layer 237 may be performed by filling the oxide layer pattern 236 with a buffer layer and then performing a chemical mechanical polishing (CMP) process. Also, the oxide layer pattern 236 is removed to completely expose the lower electrodes 240A, 242A, and 244A that are formed by the CMP process. The oxide layer pattern 236 may be removed by a wet etching process. During the wet etching process, the underlying interlayer insulating layer 200 and the first and second pads 210 and 230 are protected by the etch stop layer 235.

Figure 5D:
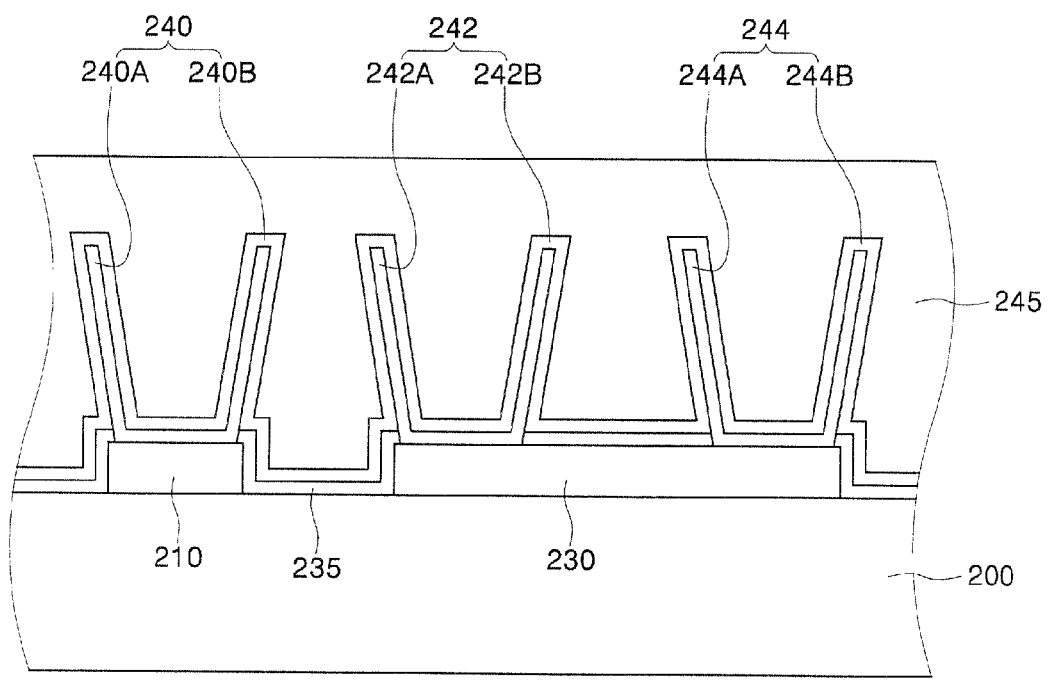

Referring to FIG. 5D, dielectric layers 240B, 242B, and 244B are formed to predetermined thicknesses on the lower electrodes 240A, 242A, and 244A and the etch stop layer 235. Thereafter, an upper electrode layer 245 is formed on the dielectric layers 240B, 242B, and 244B. The upper electrode layer 245 may be formed of a conductive material, such as polycrystalline silicon.

Figure 5E:
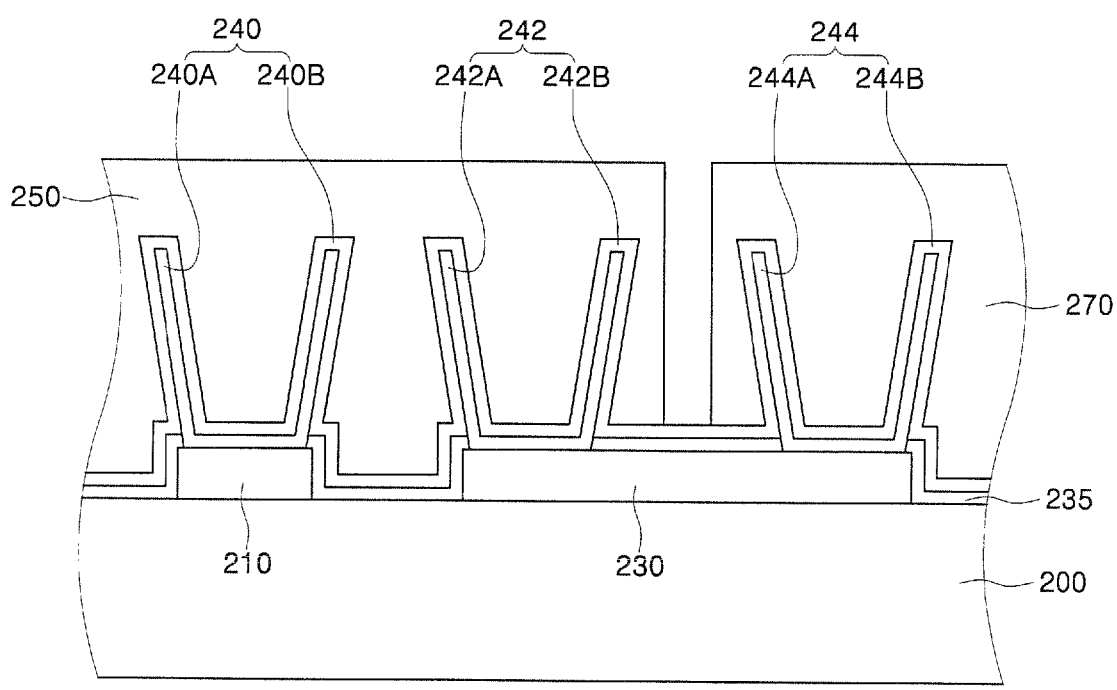

Referring to FIG. 5E, a photoresist is coated on the upper electrode layer 245 and then patterned using a typical photolithography process. An anisotropic etching process is then performed on the upper electrode layer 245, thereby forming a common upper electrode 250 of the first and second capacitors 240 and 242 and an upper electrode 270 of the third capacitor 244.

The above-described formation of the coupling capacitor is performed in the sense amplifier region (140 of FIG. 3). Also, the coupling capacitor is formed by the same process as the storage capacitor formed in the cell region 100. That is, the interlayer insulating layer that buries the cell transistor and the bit line in the cell region 100 buries the sense amplifier in the sense amplifier region 140. Accordingly, the coupling capacitor is formed in the sense amplifier region 140 through the same process as the formation of the storage capacitor in the cell region 100 except that the formation of the coupling capacitor further includes selectively etching the upper electrode layer 245 to form the common upper electrode 250 and the upper electrode 270.

Figure 6A:
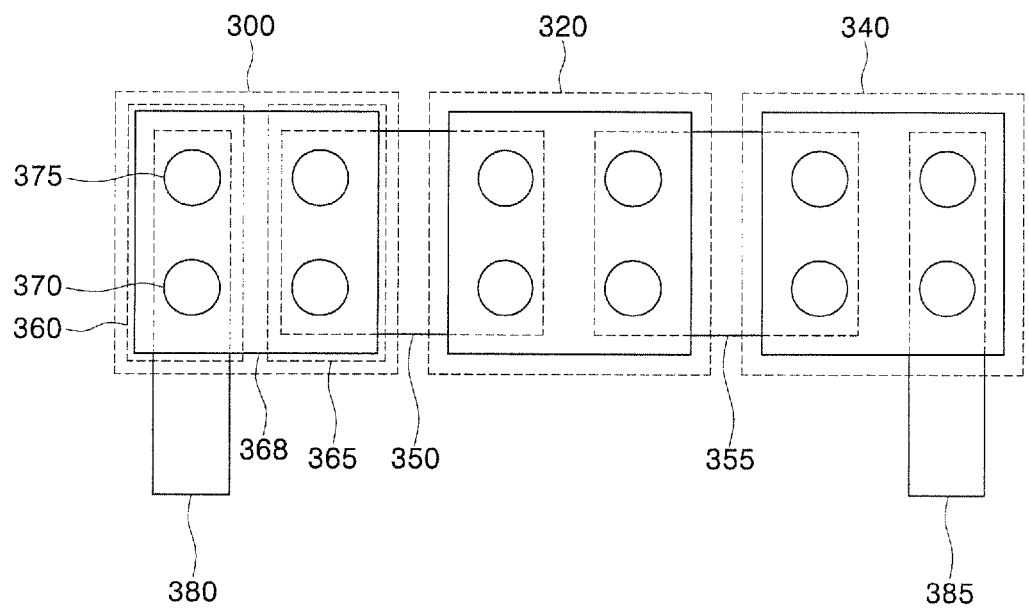
FIGS. 6A and 6B are a plan view and a circuit diagram of a coupling capacitor according to another exemplary embodiment, respectively.
Figure 6B:
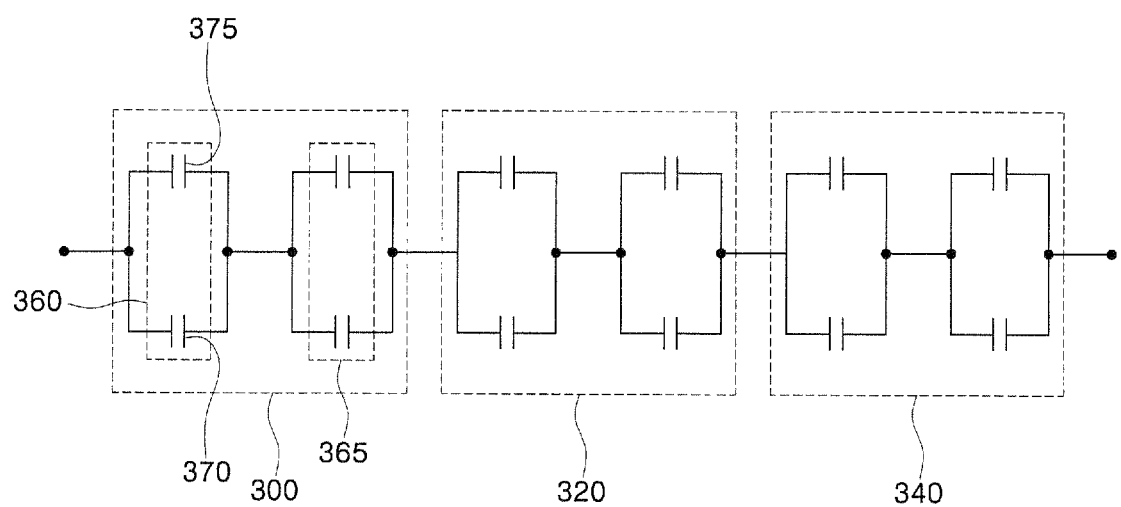

FIGS. 6A and 6B are a plan view and a circuit diagram of a coupling capacitor according to another exemplary embodiment.

FIG. 6A is a plan view of a coupling capacitor according to the other exemplary embodiment.

Referring to FIG. 6A, the coupling capacitor includes three capacitor groups 300, 320, and 340. The capacitor groups 300, 320, and 340 are connected in series to adjacent capacitor groups through common pads 350 and 355. That is, the first capacitor group 300 is electrically connected to the second capacitor group 320 through the first common pad 350, and the second capacitor group 320 is electrically connected to the third capacitor group 340 through the second common pad 355.

Each of the capacitor groups 300, 320, and 340 includes two capacitor units that are connected in series. For example, the first capacitor group 300 includes a first capacitor unit 360 and a second capacitor unit 365 that is serially connected to the first capacitor unit 360. The first and second capacitor units 360 and 365 are connected in series by a first common upper electrode 368.

Also, each of the capacitor units includes two capacitors that are connected in parallel. For example, the first capacitor unit 360 includes two capacitors 370 and 375 that are formed on a first pad 380. Accordingly, lower electrodes of the two capacitors 370 and 375 have a short circuit. Also, since the capacitors 370 and 375 use the first common upper electrode 368 as upper electrodes, upper electrodes of the capacitors 370 and 375 have a short circuit.

The capacitor groups 320 and 340 have the same structure as the above-described capacitor group 300. However, the first pad 380 of the first capacitor group 300 extends in an orthogonal direction to a line in which the capacitor groups 300, 320, and 340 are arranged so that the first pad 380 can be electrically connected to a conductive line, whereas a rightmost pad 385 of the third capacitor group 340 extends in an orthogonal direction to the line in which the capacitor groups 300, 320, and 340 are arranged so that the rightmost pad 385 can be electrically connected to another conductive line.

FIG. 6B is a circuit diagram of the coupling capacitor shown in FIG. 6A.

Referring to FIG. 6B, each of the capacitor groups 300, 320, and 340 includes four capacitors. Each of the four capacitors may have the same capacitance as a capacitance Cs of a storage capacitor.

The first capacitor group 300 includes the first capacitor unit 360 and the second capacitor unit 365 that are connected in series. Also, the first capacitor unit 360 includes two capacitors 370 and 375 that are connected in parallel. For example, when each of the capacitors 370 and 375 has the capacitance Cs, the capacitance of the first capacitor unit 375 having the parallel-connected capacitors 370 and 375 becomes 2Cs. Also, since the first capacitor unit 360 and the second capacitor unit 365 are connected in series and the second capacitor unit 365 also has a capacitance of 2Cs, the first capacitor group 300 has a capacitance of Cs.

Because the capacitor groups 300, 320, and 340 are connected in series, the capacitance of the coupling capacitor becomes ⅓Cs based on Equation 1.

That is, when a coupling capacitor includes an m number of capacitor units that are connected in series and each of the capacitor units includes an n number of capacitors that are connected in parallel, a capacitance Cc of the coupling capacitor can be expressed by Equation 2:

$$\frac{1}{Cc} = \frac{m}{nCs} \quad (2)$$

Accordingly, when m/n is set to ⅓, the capacitance Cc of the coupling capacitor is ⅓Cs.

Also, when m/n is set to ⅑, the capacitance Cc of the coupling capacitor is ⅑Cs.

As described above, when a plurality of capacitors are arranged in parallel, and the parallel-connected capacitors are connected in series, a coupling capacitor whose capacitance is maintained in an appropriate proportion to the capacitance of a storage capacitor can be fabricated.

According to the present embodiment as described above, each of capacitors of a coupling capacitor is formed by the same process as a storage capacitor. Thus, each of the capacitors of the coupling capacitor has the same capacitance as the storage capacitor. For this, the coupling capacitor is formed in a sense amplifier region, and an underlying interlayer insulating layer is formed across a cell region. Therefore, even if the capacitance of the storage capacitor is changed by a predetermined factor during a fabrication process, the coupling capacitor whose capacitance is maintained in an appropriate proportion to the capacitance of a storage capacitor can be fabricated.

Exemplary embodiments have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A coupling capacitor of a semiconductor memory device, which is disposed on an interlayer insulating layer and includes a plurality of serially connected capacitors, the serially connected capacitors respectively including lower electrodes, dielectric layers, and upper electrodes, the coupling capacitor comprising:

a first capacitor among the serially connected capacitors formed on, and including one of the lower electrodes in contact with, a first conducting pad disposed on the interlayer insulating layer;

a second capacitor among the serially connected capacitors formed on, and including one of the lower electrodes in contact with, a second conducting pad adjacent to the first conducting pad, and electrically connected to the first capacitor through a common upper electrode; and a third capacitor among the serially connected capacitors formed on, and including one of the lower electrodes in contact with, the second conducting pad and electrically connected to the second capacitor through the second conducting pad, wherein a lower electrode of the coupling capacitor is the first conducting pad and an upper electrode of the coupling capacitor is the upper electrode of the third capacitor, wherein the coupling capacitor is formed on the same interlayer insulting layer as a storage capacitor of the semiconductor memory device, and wherein each of the first, second, and third capacitors has substantially the same structure as the storage capacitor.

2. The coupling capacitor according to claim 1, wherein the first, second, and third capacitors have the same capacitance, and each of the first, second, and third capacitors has substantially the same capacitance as the storage capacitor that is included in the semiconductor memory device.

3. The coupling capacitor according to claim 1, wherein the first and second pads, and all of the upper electrodes are formed of polycrystalline silicon.

4. The coupling capacitor according to claim 1, wherein the first, second, and third capacitors are arranged in a line.

5. The coupling capacitor according to claim 4, wherein the first pad is disposed in an orthogonal direction to the line in which the first, second, and third capacitors are arranged.

6. The coupling capacitor according to claim 4, wherein the upper electrode of the third capacitor is disposed in an orthogonal direction to the line in which the first, second, and third capacitors are arranged.

7. The coupling capacitor according to claim 1, wherein the coupling capacitor has a capacitance that is one-third of that of the storage capacitor that is included in the semiconductor memory device.

8. A coupling capacitor of a semiconductor memory device, which is disposed on an interlayer insulating layer and includes a plurality of serially connected capacitor groups, each capacitor group comprising:
 a first capacitor unit formed on a first pad disposed on the interlayer insulating layer; and
 a second capacitor unit formed on a common pad adjacent to the first pad, and connected in series to the first capacitor unit through a common upper electrode,
 wherein adjacent capacitor units are electrically connected through the common pad, and capacitors of each of the first and second capacitor units are connected in parallel,
 wherein the respective capacitors of the capacitor groups have the same capacitance, and each of the capacitors of the capacitor groups has substantially the same capacitance as a storage capacitor.

9. The coupling capacitor according to claim 8, wherein the first pad, the common pad, and the common upper electrode are formed of polycrystalline silicon.

10. The coupling capacitor according to claim 9, wherein the coupling capacitor is disposed on the same interlayer insulating layer as the storage capacitor.

11. The coupling capacitor according to claim 7, wherein the coupling capacitor includes three capacitor groups that are connected in series.

12. The coupling capacitor according to claim 11, wherein the three capacitor groups are arranged in a line.

13. A semiconductor memory device comprising:
 a cell region in which a cell transistor and a storage capacitor are disposed;
 a sub-word driver region disposed in a first region adjacent to the cell region, the sub-word driver region having a sub-word driver for enabling a word line of the cell transistor; and
 a sense amplifier region disposed in a second region adjacent to the cell region, a sense amplifier and a coupling capacitor being disposed in the sense amplifier region,
 wherein the coupling capacitor is disposed on an interlayer insulating layer that buries a bit line in the cell region and the sense amplifier in the sense amplifier region, wherein the coupling capacitor is formed on the same interlayer insulating layer as the storage capacitor, wherein the coupling capacitor has substantially the same structure as the storage capacitor.

14. The semiconductor memory device according to claim 13, wherein the coupling capacitor comprises:
 a first capacitor formed on a first pad disposed on the interlayer insulating layer;
 a second capacitor formed on a second pad adjacent to the first pad, and electrically connected to the first capacitor through a common upper electrode; and
 a third capacitor formed on the second pad and electrically connected to the second capacitor through the second pad,
 wherein a lower electrode of the coupling capacitor is the first pad and an upper electrode of the coupling capacitor is the upper electrode of the third capacitor.

15. The semiconductor memory device according to claim 14, wherein the first, second, and third capacitors have the same capacitance.

16. The semiconductor memory device according to claim 15, wherein the first and second pads, and the upper electrodes are formed of polycrystalline silicon.

17. The semiconductor memory device according to claim 13, wherein the coupling capacitor includes a plurality of capacitor groups that are connected in series, each of the capacitor groups comprising:
 a first capacitor unit formed on a first pad disposed on the interlayer insulating layer; and
 a second capacitor unit formed on a common pad adjacent to the first pad, and connected in series to the first capacitor unit through a common upper electrode,
 wherein adjacent capacitor groups are electrically connected through the common pad, and capacitors of each of the first and second capacitor units are connected in parallel.

18. The semiconductor memory device according to claim 17, wherein each of the capacitors of the capacitor groups has substantially the same capacitance as the storage capacitor, and the first pad, the common pad, and the common upper electrode are formed of polycrystalline silicon.

* * * * *

UNITED STATES PATENT AND TRADEMARK OFFICE
CERTIFICATE OF CORRECTION

PATENT NO. : 7,602,043 B2  Page 1 of 1
APPLICATION NO. : 11/461344
DATED : October 13, 2009
INVENTOR(S) : Eun-Cheol Lee et al.

It is certified that error appears in the above-identified patent and that said Letters Patent is hereby corrected as shown below:

Column 4, line 10, the word "Wt," should read -- WL --;
Column 5, line 38, the word ""11."" should read -- "1." --;
Column 6, line 43, the word "to" should read -- t0 --;
Column 7, line 4, the word "/BL1 ." should read -- /BL1. --;
Column 13, line 55, the words "claim 7," should read -- claim 8, --.

Signed and Sealed this

Ninth Day of March, 2010

David J. Kappos
*Director of the United States Patent and Trademark Office*